United States Patent
McIntyre et al.

(10) Patent No.: US 9,871,473 B2
(45) Date of Patent: Jan. 16, 2018

(54) SYSTEM AND METHOD FOR ELECTROSTATIC CLAMPING OF WORKPIECES

(71) Applicant: Axcelis Technologies, Inc., Beverly, MA (US)

(72) Inventors: Edward K. McIntyre, Franklin, MA (US); Thang D. Nguyen, Lawrence, MA (US)

(73) Assignee: Axcelis Technologies, Inc., Beverly, MA (US)

(*) Notice: Subject to any disclaimer, the term of this patent is extended or adjusted under 35 U.S.C. 154(b) by 184 days.

(21) Appl. No.: 14/855,667

(22) Filed: Sep. 16, 2015

(65) Prior Publication Data

US 2016/0087557 A1    Mar. 24, 2016

Related U.S. Application Data

(60) Provisional application No. 62/052,834, filed on Sep. 19, 2014.

(51) Int. Cl.
*H01T 23/00* (2006.01)
*H02N 13/00* (2006.01)
*H01L 21/683* (2006.01)
*H01L 21/687* (2006.01)

(52) U.S. Cl.
CPC ......... *H02N 13/00* (2013.01); *H01L 21/6833* (2013.01); *H01L 21/68742* (2013.01)

(58) Field of Classification Search
CPC .................................................... H02N 13/00

USPC ......................................................... 361/234
See application file for complete search history.

(56) References Cited

U.S. PATENT DOCUMENTS

| | | | | |
|---|---|---|---|---|
| 8,228,658 B2* | 7/2012 | Purohit | ............... | H01L 21/6833 361/234 |
| 8,422,193 B2* | 4/2013 | Tao | ...................... | H01L 21/6833 361/234 |
| 8,514,544 B2* | 8/2013 | McAnn | ............... | H01L 21/6833 361/234 |

\* cited by examiner

*Primary Examiner* — Stephen W Jackson
(74) *Attorney, Agent, or Firm* — Eschweiler & Potashnik, LLC

(57) ABSTRACT

A system and method for clamping a workpiece to an electrostatic clamp (ESC) comprises placing a first workpiece on a surface of the ESC and applying a first set of clamping parameters to the ESC, therein clamping the first workpiece to the surface of the ESC with a first clamping force. A degree of clamping of the workpiece to the ESC is determined and the application of the first set of clamping parameters to the ESC is halted based on a process recipe. A second set of clamping parameters is applied to the ESC after halting the application of the first set of clamping parameters to the ESC, and the workpiece is removed from the surface of the ESC concurrent with the application of the second set of clamping parameters to the ESC when the degree of clamping of the workpiece to the ESC is less than or approximately equal to a threshold clamping value. The second set of clamping parameters to the ESC is further halted after removing the workpiece from the surface of the ESC.

18 Claims, 4 Drawing Sheets

SYSTEM AND METHOD FOR ELECTROSTATIC CLAMPING OF WORKPIECES

REFERENCE TO RELATED APPLICATIONS

This application claims the benefit of U.S. Provisional Application No. 62/052,834 filed Sep. 19, 2014, entitled "SYSTEM AND METHOD FOR ELECTROSTATIC CLAMPING OF WORKPIECES", the contents of which are herein incorporated by reference in their entirety.

FIELD

The present invention relates generally to electrostatic clamping systems, and more specifically to system and method for quickly releasing electrostatically clamped workpieces.

BACKGROUND

Electrostatic clamps or chucks (ESCs) are often utilized in the semiconductor industry for clamping workpieces or substrates during plasma-based or vacuum-based semiconductor processes such as ion implantation, etching, chemical vapor deposition (CVD), etc. Clamping capabilities of the ESCs, as well as workpiece temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., ion implantation), a clamping voltage is typically applied between the wafer and the electrode, wherein the wafer is clamped against the surface of the ESC by electrostatic forces.

Most electrostatic clamps exhibit "sticking" behavior at one time or another, whereby a workpiece is retained against a surface of the ESC, despite the ESC not being powered. Sticking of a workpiece to the surface of an ESC is generally attributed to residual electrostatic charges at the interface between the ESC and workpiece not finding a rapid path to electrical ground after removal of power to the electrodes of the ESC. The nature, amount, and distribution of the residual charge is generally uncontrolled, since the phenomena that retains the charge is also generally uncontrolled and not well understood.

The retaining phenomena may vary daily or even hourly, as well as varying based on the particular ESC and workpiece lot undergoing clamping. The sticking behavior impacts throughput of workpieces through the system, and is therefore problematic.

Accordingly, a need exists in the art for an apparatus, system, and method for mitigating residual clamping of a workpiece to ESCs, while improving workpiece throughput and minimizing breakage of workpieces.

DETAILED DESCRIPTION

Figure 1:
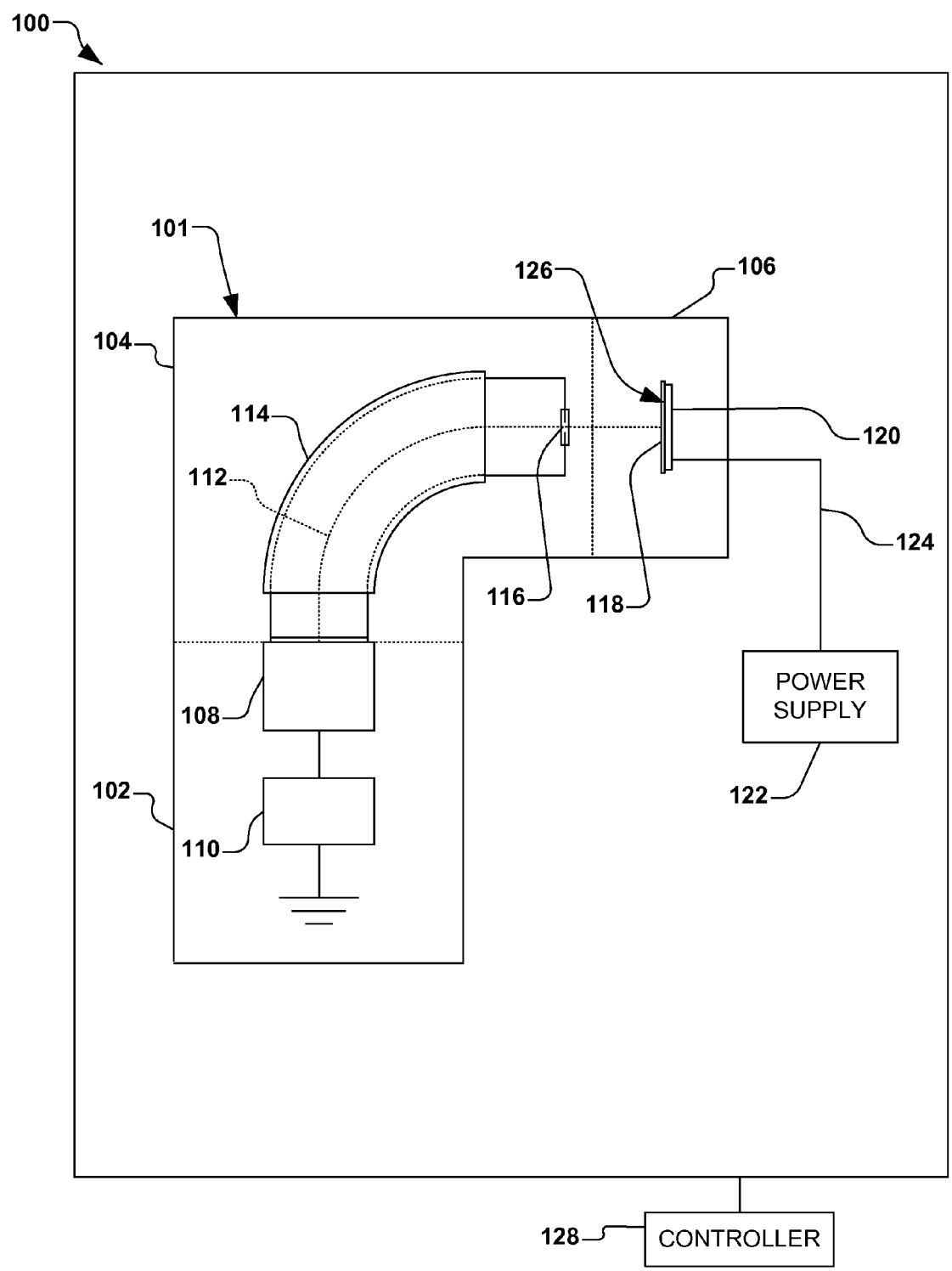
FIG. 1 is a block diagram of an exemplary vacuum system utilizing an ESC in accordance with several aspects of the present disclosure.

The present disclosure is directed generally toward a system, apparatus, and method for minimizing a de-clamping time of workpieces from an electrostatic clamp. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

In accordance with one aspect of the present disclosure, FIG. 1 illustrates an exemplary vacuum system 100 in which various aspects of the present may be practiced. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106. Generally speaking, an ion source 108 in the terminal 102 is coupled to a power supply 110 to ionize a dopant gas into a plurality of ions and to form an ion beam 112. The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to an electrostatic clamp 120 (ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ESC 120, for example, comprises an alternating current (AC) clamp (e.g., a three-phase ESC) coupled to an appropriate power supply 122 (e.g., a three-phase power supply). The power supply 122, for example, is configured or operable to control a current, voltage, and frequency of AC power 124 supplied to the ESC 120, therein selectively clamping the workpiece 118 to a surface 126 of the ESC. A controller 128, for example, is further provided, wherein the controller is operable to control the power supply 122 and/or various other aspects of the vacuum system 100.

Figure 2:
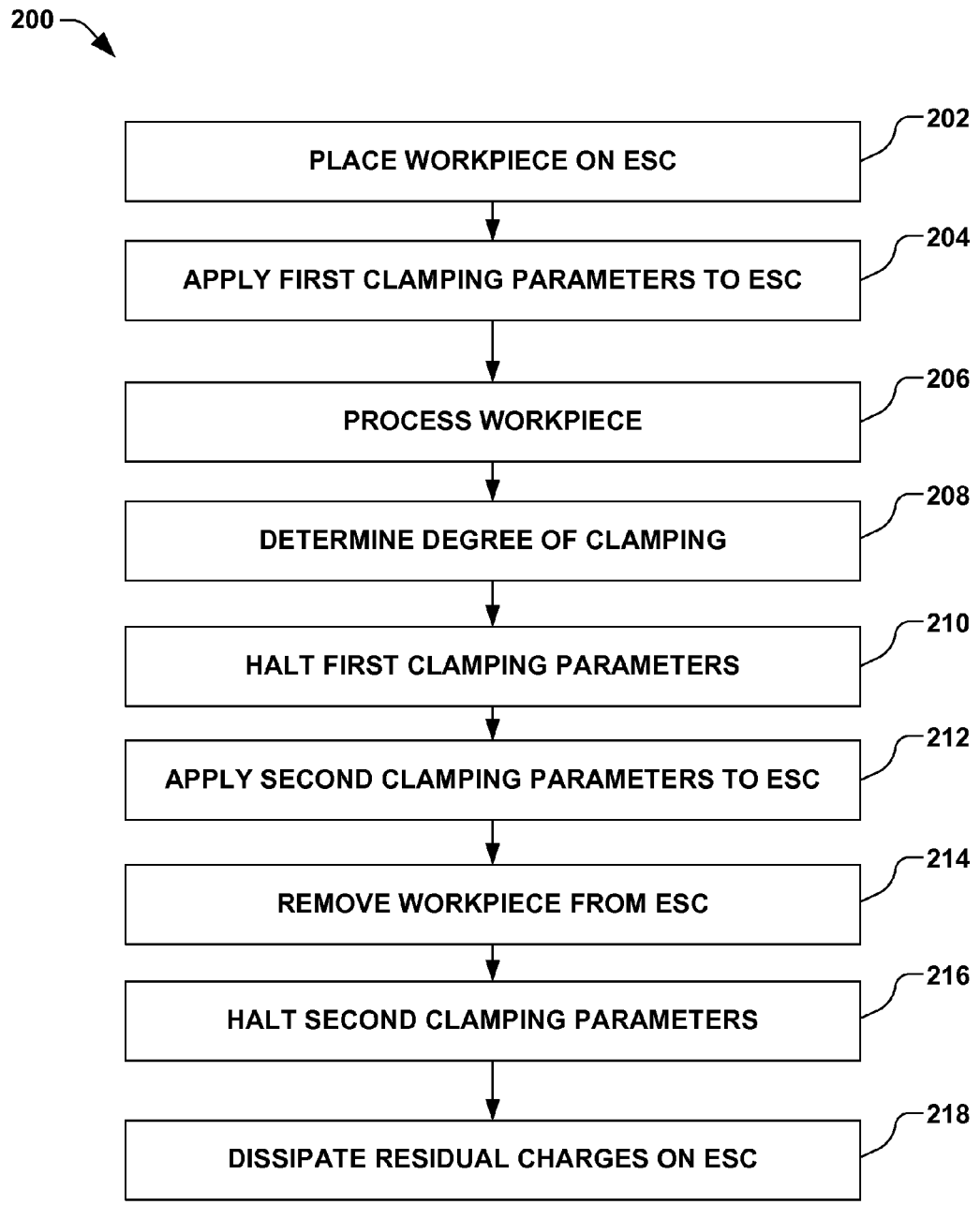
FIG. 2 illustrates a flow methodology for minimizing a de-clamping time of a workpiece from an ESC, in accordance with still another aspect.

In accordance with the disclosure, FIG. 2 illustrates an exemplary method 200 for clamping and de-clamping a workpiece from an ESC. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 2 begins at act 202, wherein a first workpiece is placed on a surface of the ESC. In act 204, a first set of clamping parameters is applied to the ESC, therein clamping the first workpiece to the surface of the ESC with a first clamping force. The first set of clamping parameters, for example, comprises a first alternating current (AC) voltage applied to one or more electrodes at a first frequency. For example, three phases of the first AC voltage may be applied to three electrodes of the ESC. Furthermore, once act 204 is performed, a processing of the workpiece may be performed in act 206, such as an ion implantation process.

In act 208, a degree of clamping of the workpiece to the ESC is determined. For example, one or more of a clamping force and a position of the workpiece with respect to the ESC is determined in act 208. In one example, act 208 may be performed concurrently with other acts or continuously throughout the method 200, such as being performed concurrent with the processing of the workpiece in act 206. In another example, the degree of clamping of the workpiece to the ESC is determined at least concurrent with both the application of the first set of clamping parameters to the ESC and the second set of clamping parameters to the ESC. In one example, the determination of the degree of clamping of the workpiece to the ESC in act 208 may be determined by the controller 128 of FIG. 1, or may comprise receiving a clamping status from a separate controller (not shown) associated with the ESC 120.

In act 210 of FIG. 2, the application of the first set of clamping parameters to the ESC is halted, and in act 212, a second set of clamping parameters is applied to the ESC. For example, the first set of clamping parameters to the ESC may be halted in act 210 based on a process recipe for processing the workpiece. The second set of clamping parameters applied in act 212, for example, comprises a second AC voltage at a second frequency. In one example, the first AC voltage is approximately an order of magnitude greater than the second voltage. In another example, the first frequency is approximately an order of magnitude less than the second frequency. For example, the first AC voltage may be on the order of approximately 600-1200 volts and the first frequency may be on the order of approximately 1-5 Hertz. Further, the second AC voltage may be on the order of approximately 50-200 volts and the second frequency may be on the order of approximately 80-120 hertz.

In act 214, the workpiece is removed from the surface of the ESC concurrent with the application of the second set of clamping parameters to the ESC when the degree of clamping of the workpiece to the ESC is less than or approximately equal to a threshold clamping value. The threshold clamping value, for example, comprises a threshold clamping force between the workpiece and ESC that may be overcome by a physical removal of the workpiece from the ESC (e.g., via a robot or other removal mechanism), wherein no adverse effects would be presented to either the workpiece or ESC. In one example, a backside gas may be provided between the ESC and the workpiece from a backside gas source, wherein the backside gas generally decreases the degree of clamping of the workpiece to the ESC concurrent with the application of the second set of clamping parameters to the ESC. For example, a backside gas vent that would normally allow backside gas to vent to the surroundings can be blocked such that the backside gas (e.g., approximately 10 torr or less) aids in removal of the workpiece from the ESC.

In act 216, the second set of clamping parameters to the ESC is halted concurrent with or after removing the workpiece from the surface of the ESC. The method 200 may be then repeated for additional workpieces. In one example, the second set of clamping parameters to the ESC are halted in act 216, and residual charges on the ESC are allowed to dissipate in act 218 prior to the second workpiece being placed on the surface of the ESC. In another example, the second workpiece may be placed on the surface of the ESC despite residual charge being left on the ESC (e.g., concurrent with act 218).

Figure 3:
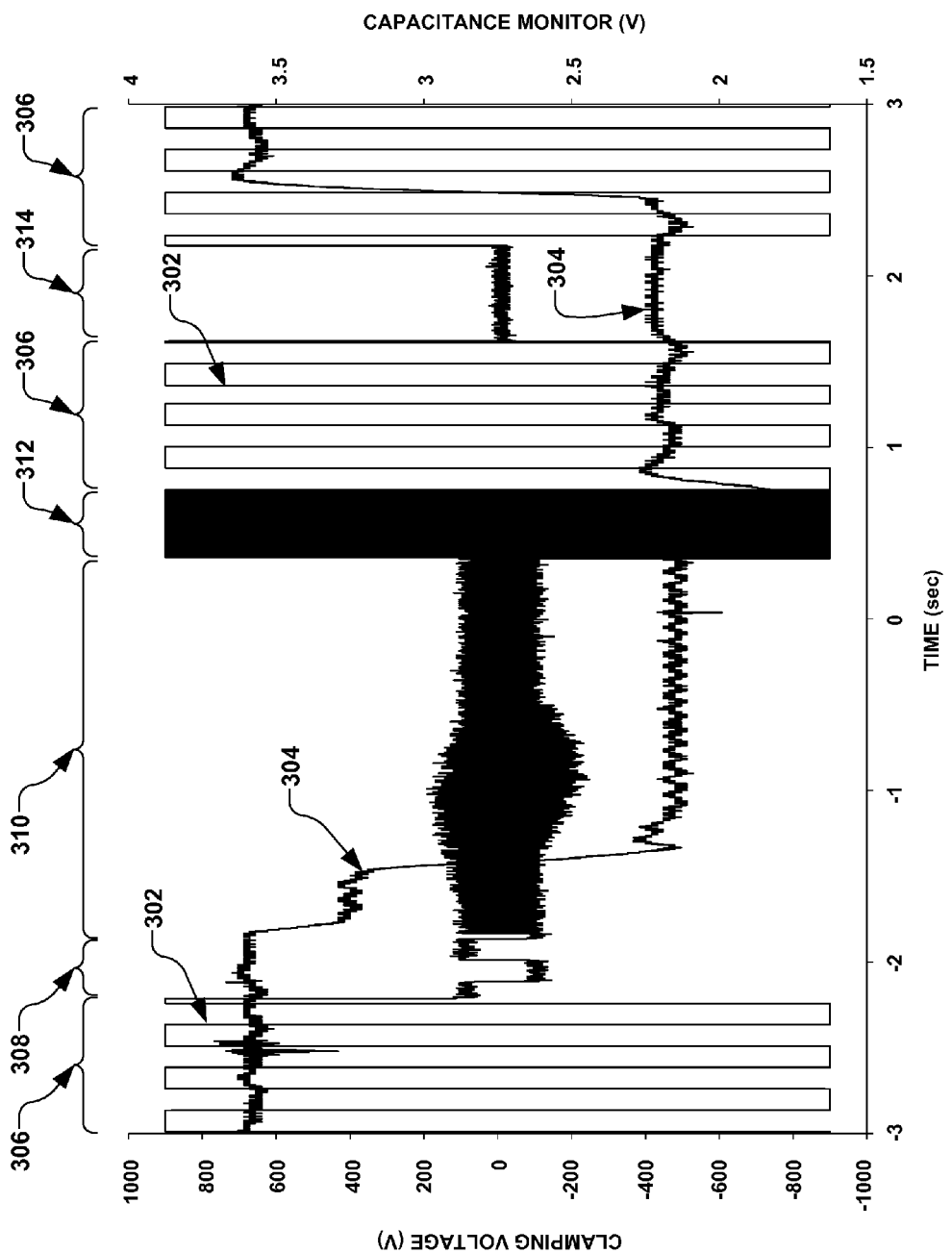
FIG. 3 is a graph illustrating exemplary clamping voltages during workpiece transfer periods according to another aspect.

FIG. 3 illustrates another example of the methodology of the present disclosure, with general reference to the exemplary vacuum system 100 of FIG. 1. The ESC 120 of FIG. 1, for example, is controlled by the controller 128 such as to provide a voltage waveform 302 (e.g., a 'boxcar' pattern) of FIG. 3 of alternating polarity voltages of up to 1100V at frequencies up to 100 Hz. The ESC 120 of FIG. 1, for example, utilizes three channels of AC power, wherein each channel or phase is delayed by 120 degrees from the other, with each channel or phase is controlled to respectively provide the voltage waveform 302 of FIG. 3. Thus, the clamping conditions are generally defined by the voltage and frequency associated with the voltage waveform 302, wherein the clamping condition can be monitored via a capacitance monitor waveform 304 (e.g., derived from analysis of a waveform 302) associated with a capacitance between the ESC 120 and workpiece 118 of FIG. 1.

It is presently appreciated that clamping force decreases with decreasing voltage and/or increasing frequency. If the clamping voltage is set to a low value, such as 10-100 V, and the frequency is set to a high value, such as 100 Hz, it may be difficult to fully clamp the workpiece 118 to the ESC 120 of FIG. 1 with sufficient clamping forces concurrent with the desired processing. However, at these settings (e.g., 10 V, 100 Hz) the workpiece 118 is in a reproducible state of de-clamping. As such, the ESC 120 of FIG. 1, for example, is controlled by the controller 128 to provide the first set of clamping parameters for clamping the workpiece 118 to the ESC 120 concurrent with processing of the workpiece, as well as the second set of clamping parameters, wherein the low voltage/high frequency condition of the second set of clamping parameters creates a "controlled" de-clamped state, wherein the workpiece 118 is clamped with a significantly limited clamping force. Stickiness (e.g., the time taken for full removal of the workpiece from the ESC 120) is correlated with an increased capacitance during the period when the workpiece is awaiting removal. During this interval, the residual charge expresses itself, and some action could be taken to ameliorate the situation.

It is possible to take advantage of this by using the controller 128 of FIG. 1 to modify the operational settings of the ESC 120 from those that provide the desired clamping for processing (e.g., the first set of clamping parameters) to settings at which clamping is weak (e.g., the second set of clamping parameters), but still providing some clamping force. For example, during the course of a conventional ion implantation, the voltage and frequency may be set to 900V and 2 Hz, respectively.

At the end of the ion implantation, the ESC 120 and workpiece 118 are conventionally positioned in a safe, horizontal "home" position, and the voltage and frequency settings on the ESC are conventionally set to zero for removal of the workpiece from the ESC. However, in such a conventional system, relatively unknown residual charges can be present between the ESC 120 and workpiece 118, thus leading to uncontrolled "sticking" of the workpiece to the ESC.

Thus, in accordance with the current disclosure, the voltage and frequency to the ESC 120 are adjusted from the first set of clamping parameters (e.g., a "Hi V/low F" condition) to the second set of clamping parameters (e.g., a "Low V/Hi F" condition), thus permitting the workpiece 118 to be advantageously removed from the ESC 120, regardless of residual charge. After the workpiece 118 is removed from the ESC 120, the controller 128 may be configured to set the clamping conditions back to those for ion implantation (e.g., the first set of clamping parameters). Accordingly, the changes in the clamping conditions can be achieved quickly, while keeping with high workpiece throughput.

In the example illustrated in FIG. 3, in a strong clamping period 306, the first set of clamping parameters are applied to the ESC. In the present example, an implant is underway concurrent with the strong clamping period 306, wherein the first set of clamping parameters are set to 900V/2 Hz. At the end of the implant, of example, a command is issued by the controller to position the ESC in a home position to be readied for removal of the workpiece. Proximate to the end of the implant, a first transition period 308, for example, is provided whereby the clamping voltage is reduced serially or in parallel with an increase in clamping frequency. In the first transition region 308, the clamping between the workpiece and ESC is transitioned from strong clamping to weak clamping.

In a weak clamping period 310, the clamping voltage is controlled to a low voltage, while the clamping frequency is increased (e.g., from approximately 900V/2 Hz to 100V/100 Hz). Concurrent with the weak clamping period 310 (e.g., the second set of clamping parameters being applied to the ESC), the workpiece may be removed from the ESC. It is noted in the present example that the time required for the change from the strong clamping period 306 to the weak clamping period 310 is not in the 'critical path' of workpiece handling, and as such, the first transition period 308 is present, whereby the change can be reliably controlled. The first transition period 308, for example, may be omitted, however, whereby the strong clamping period 306 may be immediately followed by the weak clamping period 310.

Concurrent with the first transition period 308 and/or weak clamping period 310, for example, the controller 128 of FIG. 1 may be configured to assess the analog capacitance behavior of the ESC 120 experienced with de-clamping. If, for example, the controller 128 determines that the workpiece is de-clamping normally with little "stickiness", conventional de-clamping of the workpiece can be performed. However, if the controller 128 determines that the workpiece and ESC are exhibiting stickiness, second set of clamping parameters (e.g., Low V/Hi F) may be applied concurrent with the weak clamping period 310, thus creating a controlled low-clamping force state for advantageous removal and replacement of workpieces from and to the ESC. In another example, the second set of parameters are applied for removal of each workpiece.

The controller 118, for example, may command the ESC and workpiece to be moved concurrent with the second set of clamping parameters established, such as concurrent with the weak clamping period 310. Once the workpiece is removed from the ESC, another workpiece may be placed on the ESC and the strong clamping period 306 may be re-established. A second transition period 312 may intervene between transition between the weak clamping period 310 and strong clamping period 306, whereby the clamping voltage is increased, while maintaining the high frequency of the weak clamping period 310. Other examples, such as varying one or both of the clamping voltage and clamping frequency are also contemplated. For example, a zero clamping period 314 may be provided, whereby the clamping voltage and clamping frequency are both set to zero, such as being concurrent with a placement of another workpiece 118 on the ESC 120 prior to subsequent processing.

Accordingly, the above methodology is to coordinate the settings of the controller 128 to create reproducible states of very weak clamping in order to eliminate uncontrolled 'sticking' behavior at the ESC 120.

Figure 4:
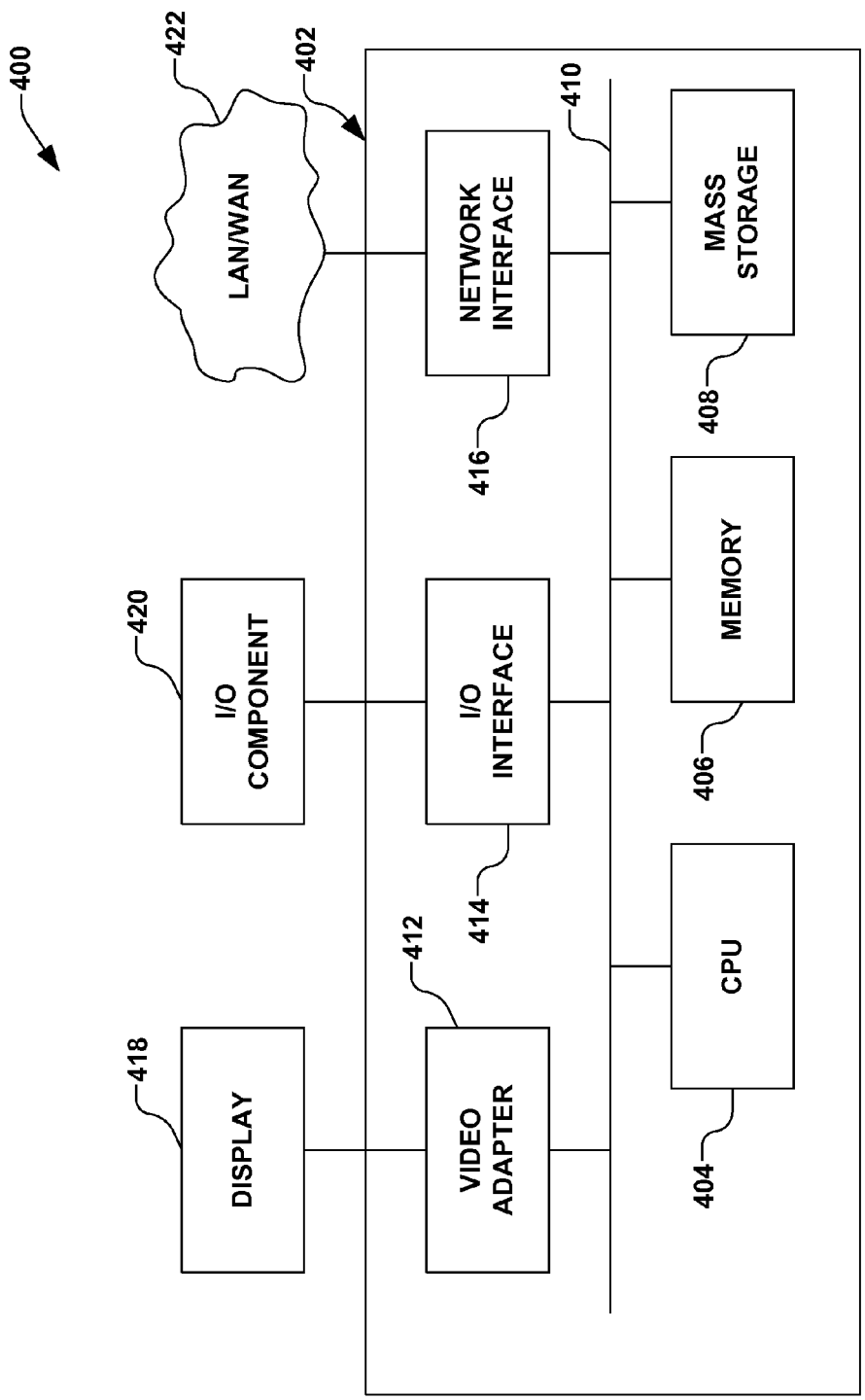
FIG. 4 is a block diagram illustrating an exemplary control system in accordance with another aspect.

In accordance with another aspect, the aforementioned methodology may be implemented using computer program code in one or more general purpose computer or processor based system. As illustrated in FIG. 4, a block diagram is provided of a processor based system 400 in accordance with another embodiment. The processor based system 400 is a general purpose computer platform and may be used to implement processes discussed herein. The processor based system 400 may include a processing unit 402, such as a desktop computer, a workstation, a laptop computer, or a dedicated unit customized for a particular application. The processor based system 400 may be equipped with a display 418 and one or more input/output devices 420, such as a mouse, a keyboard, or printer. The processing unit 402 may include a central processing unit (CPU) 404, memory 406, a mass storage device 408, a video adapter 412, and an I/O interface 414 connected to a bus 410.

The bus 410 may be one or more of any type of several bus architectures including a memory bus or memory controller, a peripheral bus, or video bus. The CPU 304 may include any type of electronic data processor, and the memory 306 may include any type of system memory, such as static random access memory (SRAM), dynamic random access memory (DRAM), or read-only memory (ROM).

The mass storage device 408 may include any type of storage device configured to store data, programs, and other information and to make the data, programs, and other information accessible via the bus 410. The mass storage device 308 may include, for example, one or more of a hard disk drive, a magnetic disk drive, or an optical disk drive.

The video adapter 412 and the I/O interface 414 provide interfaces to couple external input and output devices to the processing unit 402. Examples of input and output devices include the display 418 coupled to the video adapter 412 and the I/O device 420, such as a mouse, keyboard, printer, and the like, coupled to the I/O interface 414. Other devices may be coupled to the processing unit 402, and additional or fewer interface cards may be utilized. For example, a serial interface card (not shown) may be used to provide a serial interface for a printer. The processing unit 402 also may include a network interface 416 that may be a wired link to a local area network (LAN) or a wide area network (WAN) 422 and/or a wireless link.

It should be noted that the processor based system 400 may include other components. For example, the processor based system 400 may include power supplies, cables, a motherboard, removable storage media, cases, and the like. These other components, although not shown, are considered part of the processor based system 400.

Embodiments of the present disclosure may be implemented on the processor based system 400, such as by program code executed by the CPU 404. Various methods according to the above-described embodiments may be implemented by program code. Accordingly, explicit discussion herein is omitted.

Further, it should be noted that the modules and devices in FIG. 1 and methods of FIGS. 2 and 3 may all be implemented on one or more processor based systems 400 of FIG. 4. Communication between the different modules and devices may vary depending upon how the modules are implemented. If the modules are implemented on one processor based system 400, data may be saved in memory 406 or mass storage 408 between the execution of program code for different steps by the CPU 404. The data may then be provided by the CPU 404 accessing the memory 406 or mass storage 408 via bus 410 during the execution of a respective step. If modules are implemented on different processor based systems 400 or if data is to be provided from another storage system, such as a separate database, data can be provided between the systems 400 through I/O interface 414 or network interface 416. Similarly, data provided by the devices or stages may be input into one or more processor based system 300 by the I/O interface 414 or network interface 416. A person having ordinary skill in the art will readily understand other variations and modifications in implementing systems and methods that are contemplated within the scope of varying embodiments.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A method for clamping a workpiece to an electrostatic clamp, the method comprising:
    placing a first workpiece on a surface of the electrostatic clamp;
    applying a first set of clamping parameters to the electrostatic clamp, therein clamping the first workpiece to the surface of the electrostatic clamp with a first clamping force;
    determining a degree of clamping of the workpiece to the electrostatic clamp;
    halting the application of the first set of clamping parameters to the electrostatic clamp;
    applying a second set of clamping parameters to the electrostatic clamp after halting the application of the first set of clamping parameters to the electrostatic clamp;
    removing the workpiece from the surface of the electrostatic clamp concurrent with the application of the second set of clamping parameters to the electrostatic clamp when the degree of clamping of the workpiece to the electrostatic clamp is less than or approximately equal to a threshold clamping value; and
    halting the second set of clamping parameters to the electrostatic clamp after removing the workpiece from the surface of the electrostatic clamp.

2. The method of claim 1, further comprising:
    placing a second workpiece on the surface of the electrostatic clamp; and
    applying the first set of clamping parameters to the electrostatic clamp, therein clamping the second workpiece to the surface of the electrostatic clamp with the first clamping force.

3. The method of claim 1, wherein the first set of clamping parameters comprises a first AC voltage at a first frequency, and wherein the second set of clamping parameters comprises a second AC voltage at a second frequency, wherein the first AC voltage is greater than the second AC voltage, and wherein the first frequency is less than the second frequency.

4. The method of claim 3, wherein the first AC voltage is approximately an order of magnitude greater than the second AC voltage, and wherein the first frequency is approximately an order of magnitude less than the second frequency.

5. The method of claim 3, wherein the first AC voltage is on the order of approximately 600-1200 volts and the first frequency is on the order of approximately 1-5 Hertz, and wherein the second AC voltage is on the order of approximately 50-200 volts and the second frequency is on the order of approximately 80-120 Hertz.

6. The method of claim 1, wherein the degree of clamping of the workpiece to the electrostatic clamp is determined concurrent with both the application of the first set of clamping parameters to the electrostatic clamp and the second set of clamping parameters to the electrostatic clamp.

7. The method of claim 1, further comprising providing a backside gas between the electrostatic clamp and the workpiece, wherein the backside gas generally decreases the degree of clamping of the workpiece to the electrostatic clamp concurrent with the application of the second set of clamping parameters to the electrostatic clamp.

8. The method of claim 1, wherein the first set of clamping parameters to the electrostatic clamp is halted based on a process recipe.

9. A system for electrostatically clamping a workpiece; the system comprising:
   an electrostatic clamp;
   a power supply operably coupled to the electrostatic clamp; and
   a controller configured to selectively apply a first set of clamping parameters and a second set of clamping parameters to the electrostatic clamp, therein respectively clamping the workpiece to the surface of the electrostatic clamp with a first clamping force and a second clamping force, wherein the controller is further configured to determine a degree of clamping of the workpiece to the electrostatic clamp, wherein the selective application of the first and second sets of clamping parameters is based, at least in part, on the degree of clamping of the workpiece to the electrostatic clamp, and wherein the controller is further configured to apply the second set of clamping parameters to the electrostatic clamp concurrent with a removal of the workpiece from the electrostatic clamp when the second clamping force is non-zero.

10. The system of claim 9, wherein the first set of clamping parameters comprises a first AC voltage at a first frequency, and wherein the second set of clamping parameters comprises a second AC voltage at a second frequency, wherein the first AC voltage is greater than the second AC voltage, and wherein the first frequency is less than the second frequency.

11. The system of claim 10, wherein the first AC voltage is approximately an order of magnitude greater than the second AC voltage, and wherein the first frequency is approximately an order of magnitude less than the second frequency.

12. The system of claim 9, wherein the degree of clamping of the workpiece to the electrostatic clamp is determined concurrent with both the application of the first set of clamping parameters to the electrostatic clamp and the second set of clamping parameters to the electrostatic clamp.

13. The system of claim 9, further comprising a backside gas source configured to provide a backside gas between the electrostatic clamp and the workpiece, wherein the backside gas source is configured to generally decrease the degree of clamping of the workpiece to the electrostatic clamp concurrent with the application of the second set of clamping parameters to the electrostatic clamp.

14. A method for clamping a workpiece to an electrostatic clamp, the method comprising:
   applying a clamping voltage to the electrostatic clamp based on a first desired clamping condition, wherein the clamping voltage has a clamping frequency associated therewith, therein clamping a workpiece to the electrostatic clamp with a first clamping force; and
   modifying the clamping voltage and clamping frequency, based, at least in part, on a second desired clamping condition associated with a second clamping force between the workpiece and the electrostatic clamp, wherein the second clamping force is non-zero and is associated with a removal of the workpiece from the electrostatic clamp, wherein the first clamping force is approximately an order of magnitude greater than the second clamping force.

15. The method of claim 14, wherein modifying the clamping voltage and frequency comprises decreasing the clamping voltage by an order of magnitude and increasing the clamping frequency by an order of magnitude.

16. The method of claim 14, further comprising sensing a presence of the workpiece on the electrostatic clamp and halting the clamping voltage applied to the electrostatic clamp once the workpiece is no longer present on the electrostatic clamp.

17. A method for clamping a workpiece to an electrostatic clamp, the method comprising:
   applying a clamping voltage to the electrostatic clamp based on a first desired clamping condition, wherein the clamping voltage has a clamping frequency associated therewith, therein clamping a workpiece to the electrostatic clamp with a first clamping force, wherein applying the clamping voltage to the electrostatic clamp comprises applying a first AC voltage at a first frequency to the electrostatic clamp; and
   modifying the clamping voltage and clamping frequency, based, at least in part, on a second desired clamping condition associated with a second clamping force between the workpiece and the electrostatic clamp, wherein the second clamping force is non-zero and is associated with a removal of the workpiece from the electrostatic clamp, and wherein modifying the clamping voltage and clamping frequency comprises applying a second AC voltage at a second frequency to the electrostatic clamp, wherein the first AC voltage is approximately an order of magnitude greater than the second AC voltage, and wherein the first frequency is approximately an order of magnitude less than the second frequency.

18. The system of claim 17, wherein a degree of clamping of the workpiece to the electrostatic clamp is determined concurrent with both the application of the first AC voltage at the first frequency to the electrostatic clamp and the application of the second AC voltage at the second frequency to the electrostatic clamp.

\* \* \* \* \*